US008396111B2

(12) United States Patent
O'Malley et al.

(10) Patent No.: US 8,396,111 B2
(45) Date of Patent: Mar. 12, 2013

(54) DIGITAL PULSE WIDTH MODULATOR

(75) Inventors: Eamon O'Malley, Claremorris (IE); Karl Rinne, Youghal (IE)

(73) Assignee: Powervation Limited, Limerick (IE)

( * ) Notice: Subject to any disclaimer, the term of this patent is extended or adjusted under 35 U.S.C. 154(b) by 290 days.

(21) Appl. No.: 12/961,975

(22) Filed: Dec. 7, 2010

(65) Prior Publication Data

US 2011/0141780 A1 Jun. 16, 2011

Related U.S. Application Data

(63) Continuation-in-part of application No. 12/620,517, filed on Nov. 17, 2009, now Pat. No. 7,848,406, which is a continuation of application No. 11/337,448, filed on Jan. 24, 2006, now Pat. No. 7,627,032, which is a continuation of application No. PCT/IE2004/000101, filed on Jul. 26, 2004.

(30) Foreign Application Priority Data

Jul. 25, 2003 (IE) .................................... 2003/0552
Jul. 26, 2004 (WO) .................. PCT/IE2004/000101

(51) Int. Cl.
*H03K 7/08* (2006.01)

(52) U.S. Cl. ...................................................... 375/238

(58) Field of Classification Search .................. 375/238; 332/109; 370/204, 205
See application file for complete search history.

(56) References Cited

U.S. PATENT DOCUMENTS 5,594,631 A 1/1997 Katoozi et al.
5,602,464 A 2/1997 Linkowsky et al.
6,038,265 A 3/2000 Pan et al.
6,498,617 B1 * 12/2002 Ishida et al. ................. 347/252
6,538,523 B2 3/2003 Sugita et al.

FOREIGN PATENT DOCUMENTS

WO WO 03/005779 1/2003
WO WO 03-050637 6/2003

OTHER PUBLICATIONS

Dancy et al., "High-Efficiency Multiple-Output DC-DC Conversion for Low—. . . " IEEE Trans . . . , vol. 8, No. 3, Jun. 2000, pp. 1-12.

* cited by examiner

*Primary Examiner* — Kevin Kim

(74) *Attorney, Agent, or Firm* — Hickman Palermo Truong Becker Bingham Wong LLP; Edward A. Becker

(57) ABSTRACT

A DPWM (1) has a locked loop (4) which receives an input clock signal and provides an out-of-phase delayed clock at the output of each cell in the loop (35). A multiplexer (5) selects one of the cell outputs at any one time. This allows the DPWM (1) to have a greater resolution which would otherwise be achieved with the same input clock. The resolution is further increased using an interpolator. A programmable module (2) has a control block (20) which interfaces with external CPU and DSP hosts and transmits programmed parameters to finite state machine controllers (15), each providing an independent output.

22 Claims, 13 Drawing Sheets

DIGITAL PULSE WIDTH MODULATOR

RELATED APPLICATIONS

This application is a continuation in part of U.S. application Ser. No. 12/620,517, filed Nov. 17, 2009 now U.S. Pat. No. 7,848,406, which in turn is a continuation of U.S. application Ser. No. 11/337,448 filed Jan. 24, 2006 now U.S. Pat. No. 7,627,032, which in turn is a continuation of PCT/IE2004/000101 filed 26 Jul. 2004 and published in English which in turn claimed priority from Irish Patent Application No. 2003/0552 filed on 25 Jul. 2003, the entire contents of each of which are herein incorporated by reference.

FIELD

This application relates to digital pulse width modulators (DPWMs) for applications such as power supply control

PRIOR ART DISCUSSION

A DPWM generates a pulse width modulated (PWM) output signal which repeats over a fixed time interval called the switching period $T_s$ ($T_s=1/F_s$). Generally, the PWM signal switches from a low to high logic state at the start of a switching period and toggles between a logic high and low state at a point in time during the switching period determined by the duty-cycle (the portion of the switching period for which the signal remains in the logic high state).

A clocked counter running at a frequency much greater than the PWM switching frequency determines the point at which the PWM changes logic state. For example, there may be a transition from high to low after 200 counter clock cycles and a toggle from low to high (start of a new switching period) at 1000 counter clock cycles. This gives a duty cycle d=200/1000=20%. Thus, the resolution of the DPWM is determined by the counter clocking frequency. In general the following relationship applies $F_c=N*F_s$, where $F_c$ is the clock frequency, $F_s$ is the output PWM switching frequency, and N is the number of counts in a switching period.

There is in general a trade-off between the competing requirements of decreasing the clock frequency to reduce power consumption and circuit cost on the one hand and increasing the clock frequency to improve resolution on the other hand. FIG. 1 shows an overall layout of a known counter/comparator DPWM for which the above trade-off is a major consideration.

Another known DPWM, known as a ring-oscillator-mux DPWM is shown in FIG. 2. A problem with this type is that it requires in some circumstances a large number of delay buffers, or there is a tendency for the clock to become skewed. Also the size of the multiplexer grows exponentially with N (the number of bits resolution).

Referring to FIG. 3 a hybrid DPWM is shown. Again, however, some of the above problems can still arise. A counter/dithering DPWM is shown in FIG. 4. However long dithering patterns can cause high output AC ripple which is superimposed on the ripple from the switching action of the PWM signal.

The application is therefore directed towards providing an improved DPWM.

SUMMARY

The present application provides a DPWM comprising a counter and a comparator. The DPWM employs a locked loop circuit for delaying a received clock signal to provide multiple clock phases to simulate a higher frequency clock. Greater frequency resolution is obtained by using an interpolator circuit with the multiple clock phases.

The delay circuit suitably comprises a phase-locked or delay-locked loop circuit having a plurality of cells each providing a clock phase transition within the received clock period. A multiplexer is employed for selecting a phase from the delay circuit and providing it to an output control block.

DETAILED DESCRIPTION

Brief Description of the Drawings

The application will be more clearly understood from the following description of some embodiments thereof, given by way of example only with reference to the accompanying drawings in which.

DESCRIPTION OF THE EMBODIMENTS

Figure 1:
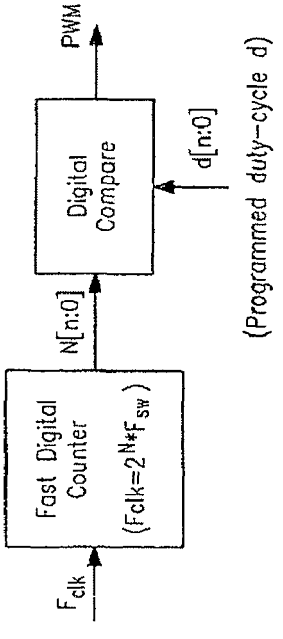
FIG. 1 is an example of a counter/comparator DPWM known from the prior art.
Figure 2:
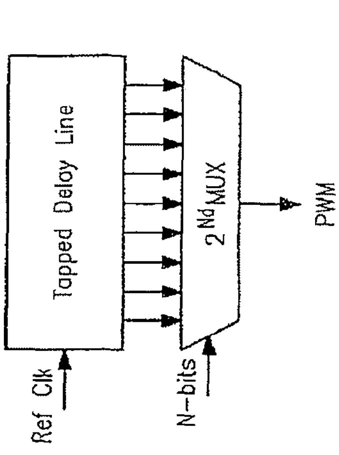
FIG. 2 is an example of a ring-oscillator-mux DPWM known from the prior art.
Figure 3:
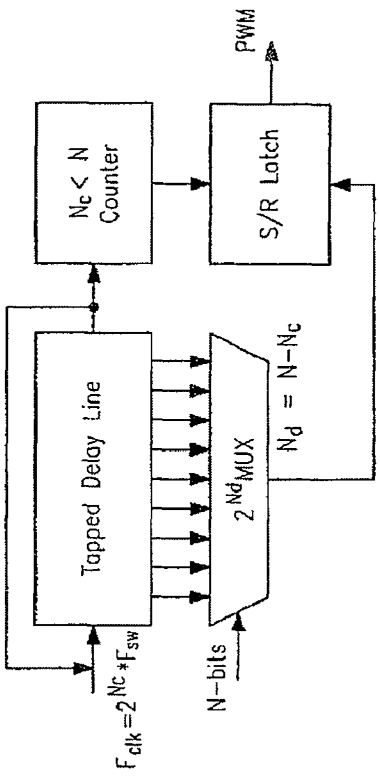
FIG. 3 is an example of a hybrid DPWM known from the prior art.
Figure 4:
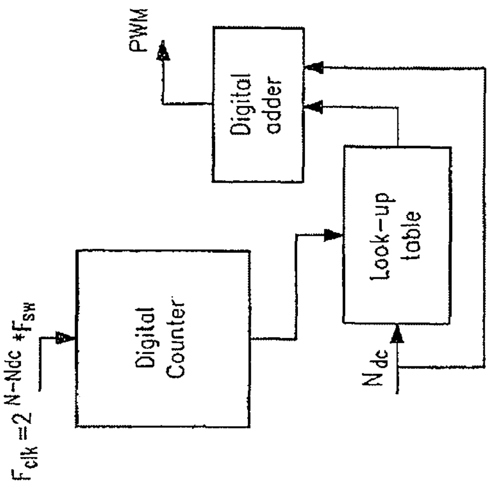
FIG. 4 is an example of a known from the prior art.
Figure 5:
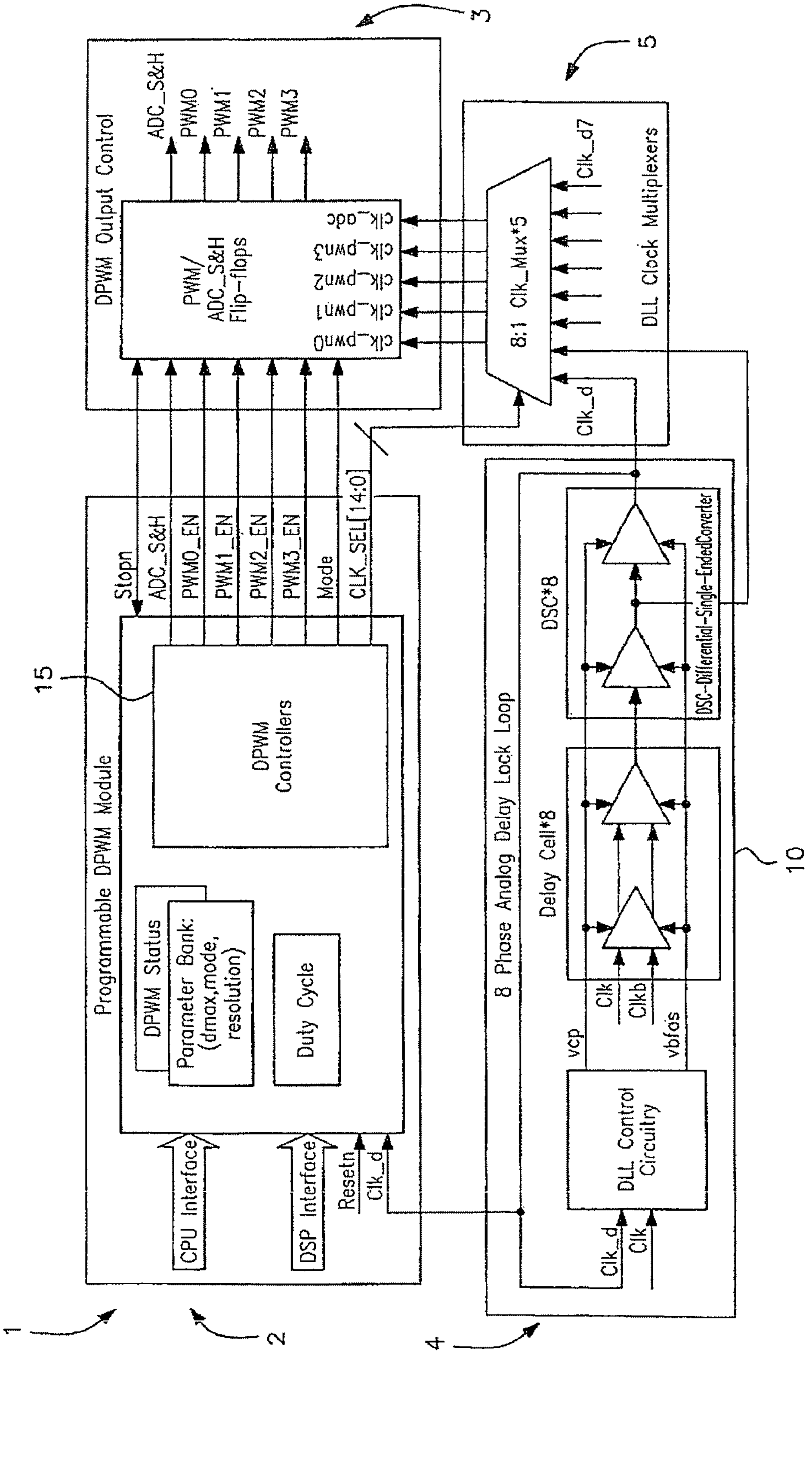
FIG. 5 is a block diagram of an exemplary DPWM according to one aspect of this application.

Referring to FIG. 5 a DPWM 1 comprises a programmable DPWM module 2, an output control block 3, an analogue delay lock loop (DLL) 4, and clock multiplexers 5. The module 2 incorporates counter and comparator functionality and so the DPWM essentially is of the counter/comparator general type. However, as described in more detail below the DLL 4 pre-processes the input clock in a manner to considerably reduce required clock frequency. The overall DPWM 1 is a single CMOS chip in this embodiment.

Figure 9:
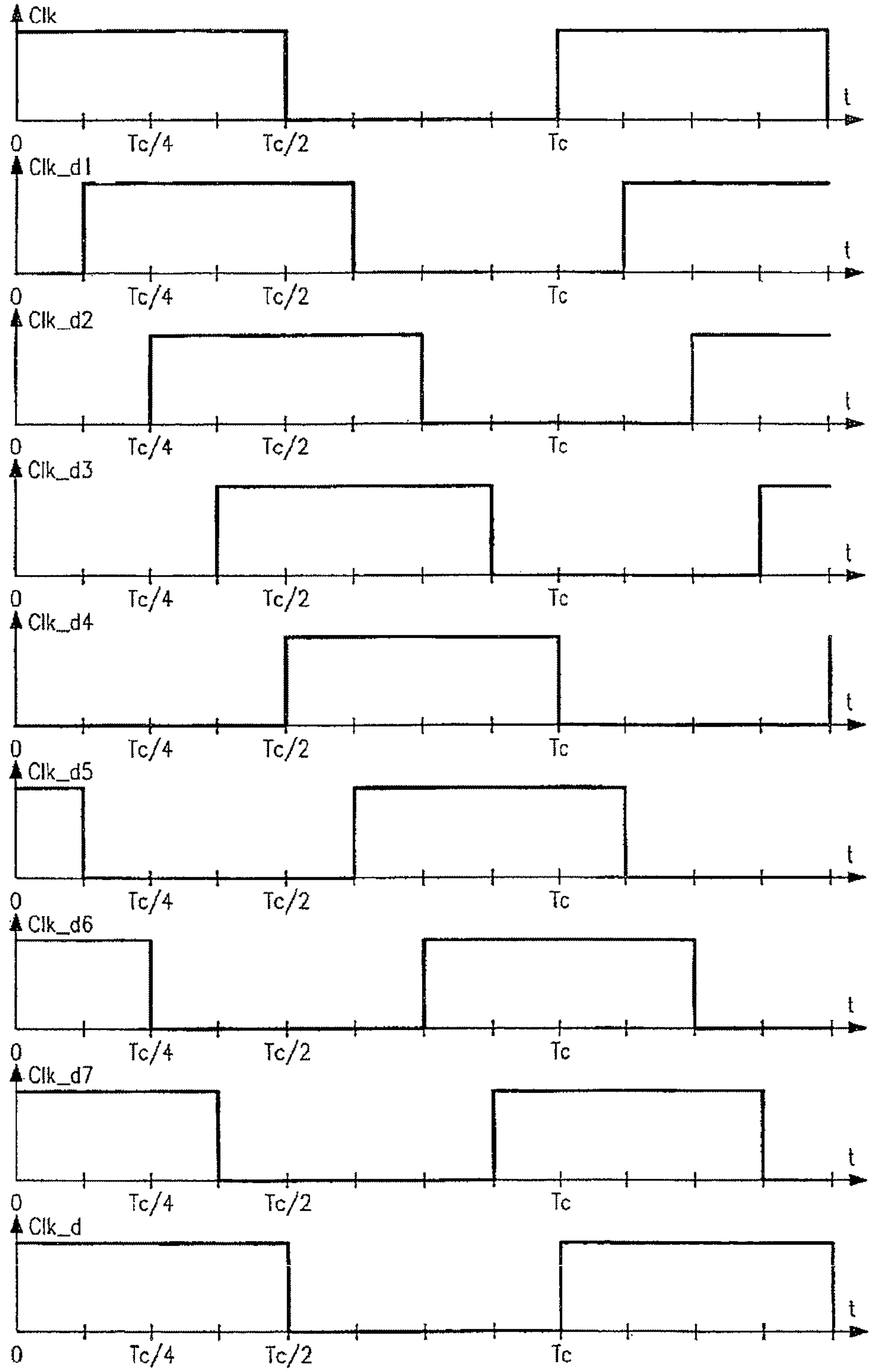
FIG. 9 shows a an input clock and individual delay stage output clocks.

This clock signal is fed to the input of the DLL 4. Assuming a DLL with M delay cells in the delay line, the DLL provides M delayed versions of the clock, one version at each delay cell output. In this example, M=8. Based on a control signal (three least significant bits of the duty cycle value) to the module 2, the multiplexer 5 chooses one of the delayed clock phases. Hence, without an increase in clock frequency, the time resolution has been increased by a factor of M. This is explained diagrammatically in FIG. 9. In particular, FIG. 9 shows the input clock Clk and the outputs of the eight delay cells in the same time dimension. Effectively, the delay cells allow the DPWM 1 to simulate a clock signal having eight times the frequency of the actual input clock.

Figure 6:
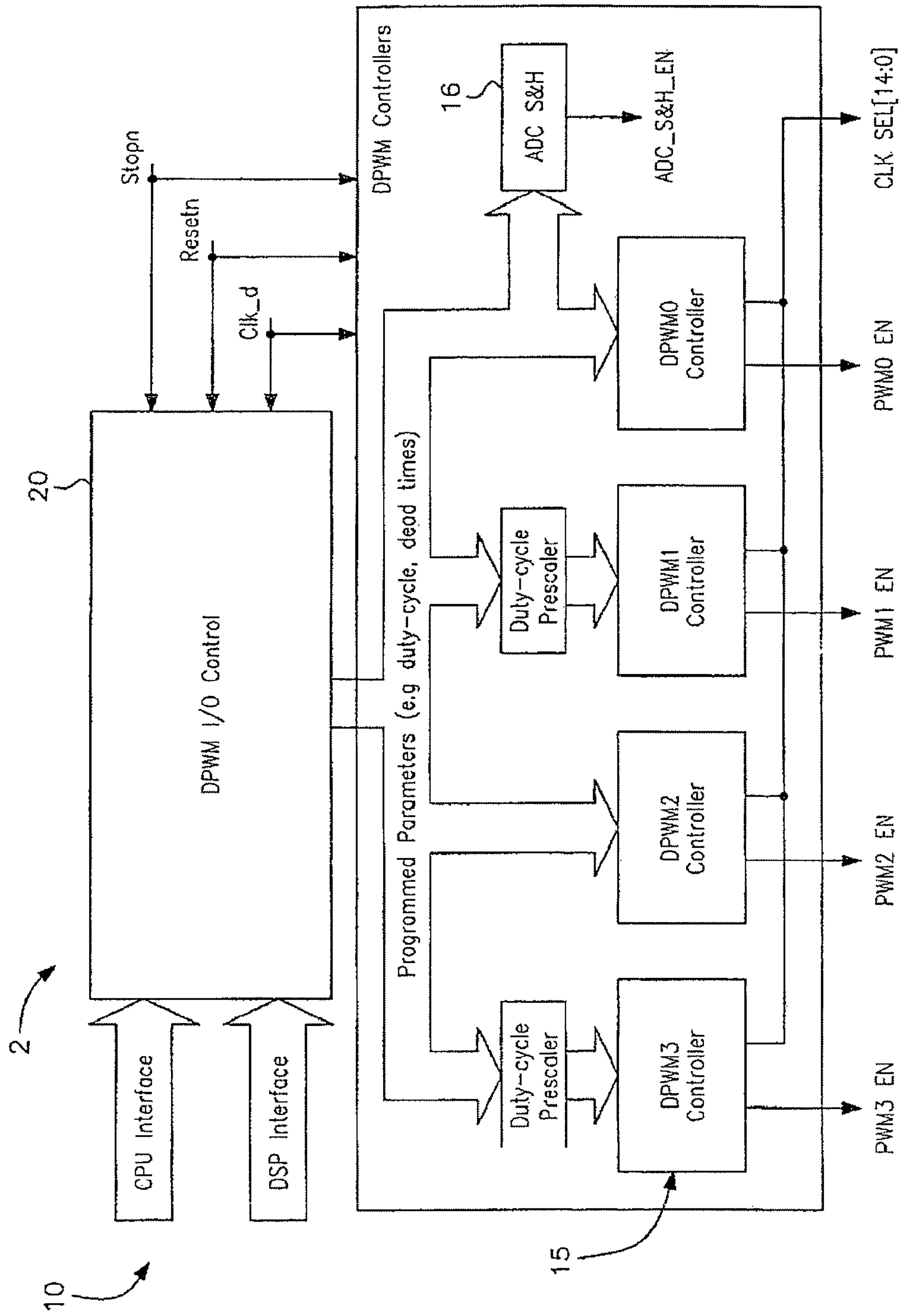
FIG. 6 is a block diagram of a programmable DPWM module of the DPWM.

Referring to FIG. 6 the module 2 is shown in more detail. DPWM controllers 15 within the module 2 can dynamically select a desired DLL clock phase to operate from based on the three least significant bits of the programmed dead and delay times for generating the additional PWM outputs. This allows the dead/delay times to be truly bit-wise accurate to the programmed resolution. A control block 20 receives external CPU and DSP instructions and routes programmed parameters to the controllers 15. The latter are effectively state machines, each of which independently generates an output. Thus the multiple outputs are not merely processed (e.g. inverted) versions of a single output.

The control block 20 also feeds programmed parameters to an ADC sample and hold (S&H) function 16. The ADC S&H function 16 produces a sample and hold signal required by circuit blocks outside the DPWM 1 (such as an external analogue-digital converter).

Figure 7:
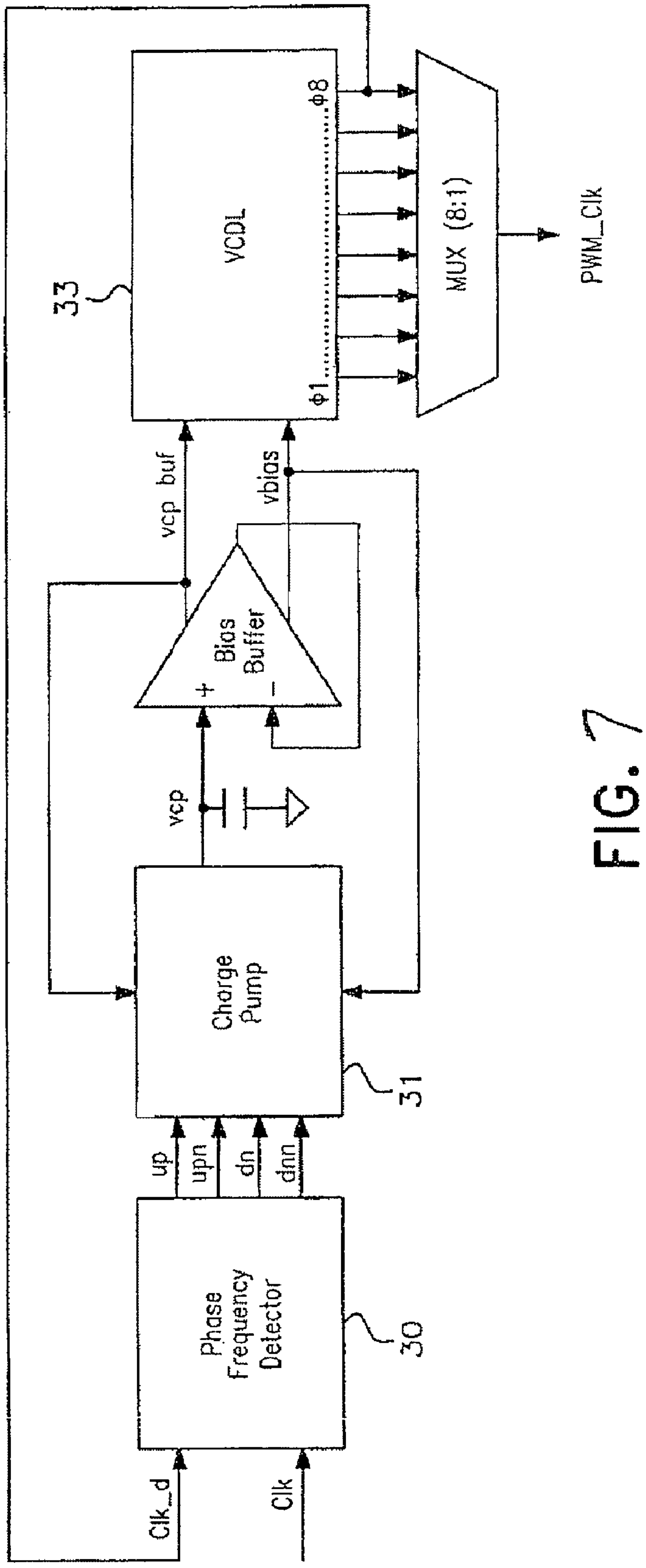
FIG. 7 is a diagram of a delay lock loop (DLL)
Figure 8:
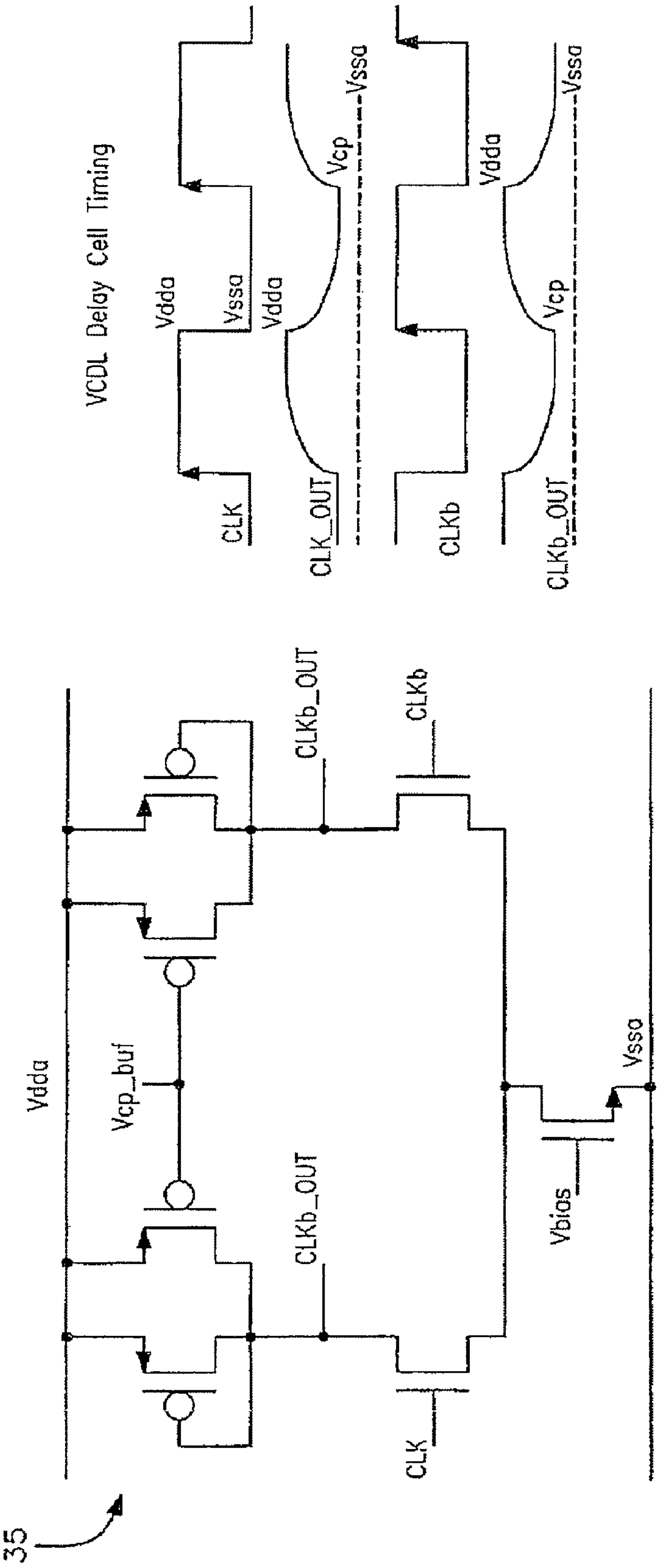
FIG. 8 is a diagram of a single voltage controlled cell and a waveform of the cell.

The DLL 4 is shown in more detail in FIG. 7. A phase frequency detector 30 feeds a charge pump 31, in turn driving a buffer 32. These together form a control circuit. The buffer 32 drives a voltage controlled delay line (VCDL) 33. A single delay cell 35 is shown in FIG. 8. The VCDL 33 incorporates the eight cascaded cells 35.

For improved jitter performance and reduced on-chip area M (number of delay cells) was chosen to be 8 for this design. The reference clock enters the first delay buffer of the VCDL and passes through the remaining series connected delay cells where the final delay stage output clk_d, is compared by the phase frequency detector to the input clk to generate a phase alignment error signal.

In operation, the DPWM 1 provides PWM switching frequency waveforms in the range of 100 kHz to 15 MHz with resolutions of 6 to 12 bits by programming the required parameters via a CPU interface and adjusting the system clock (Clk in FIG. 5) frequency $f_{clk}$ as required. These ranges of resolution and switching frequency have been achieved using a 0.35 um CMOS process to fabricate the DPWM 1.

When the DLL locks the reference input clock to the delayed clock the total delay of the delay line should be equal to exactly one period of the reference clock resulting in 8 evenly delayed phases of the clk at each buffer stage in the VCDL as shown in FIG. 9. The DLL has a lock range of 35 MHz to 145 MHz.

The programmable DPWM module 2 is a digital system operating synchronously to the DLL output clock clk_d. It supports a CPU interface allowing parameters such as duty-cycle, mode (complementary or alternating), delay/dead-times, and number of bits resolution N (6 to 12 bits) to be programmed on power up. The DSP interface allows updated duty-cycle values from a DSP feedback controller to be programmed on a switching cycle-by-cycle basis during normal operation.

The DPWM module 2 in tandem with the DLL 4 generates the PWM waveforms based on the programmed parameters at clock frequencies given by $f_{clk}=(f_{sw}*2^N)/M$ (where N is the number of bits resolution and M is the number of clock phases from the DLL, e.g. $f_{sw}$=4 MHz@8-bit resolution requires $f_{clk}$=128 MHz).

An asynchronous input Stopn from an external device supports power supply protection features (such as high-speed over-current-protection). To protect the switches in the power stages activation of Stopn resets all PWM outputs to zero within a minimum delay, in this embodiment 1 ns. Depending on the end application the DPWM 1 may either temporarily reset all PWM outputs to zero, or may reset all PWM outputs to zero in a latching fashion. In the latter case, all PWM outputs remain zero until the DPWM is instructed through the CPU interface to resume normal operation.

The I/O control block 20 of the module 2 contains all the programmable registers (e.g. duty-cycle, dead/delay times, number of bits resolution) and controls all communication via the CPU or DSP to/from the DPWM 1.

The DPWM controllers 15 generate the individual PWM waveforms. PWM3 and PWM1 duty-cycles are derived versions of the PWM0 duty-cycle based on their programmed dead-times respectively.

During the high/low time generation of the PWM waveform the count sequence for the 3 least significant bits (lsb's $b_2$-$b_0$ repeats every 8 cycles within the N-bit counter. This repetition can be avoided if instead binary 8 (b'1000) is added to bits $b_n$-$b_0$ of the N-bit counter hence reducing the $f_{clk}$ by a factor of 8. Once $b_n$-$b_3$ of the N-bit counter equal $b_n$-$b_3$ of the programmed clk, $b_2$-$b_0$ of $d_k$ select the delayed phase of $f_{clk}$ from the DLL to reset the PWM output (CLK_SEL signals in FIG. 5)

Figure 10:
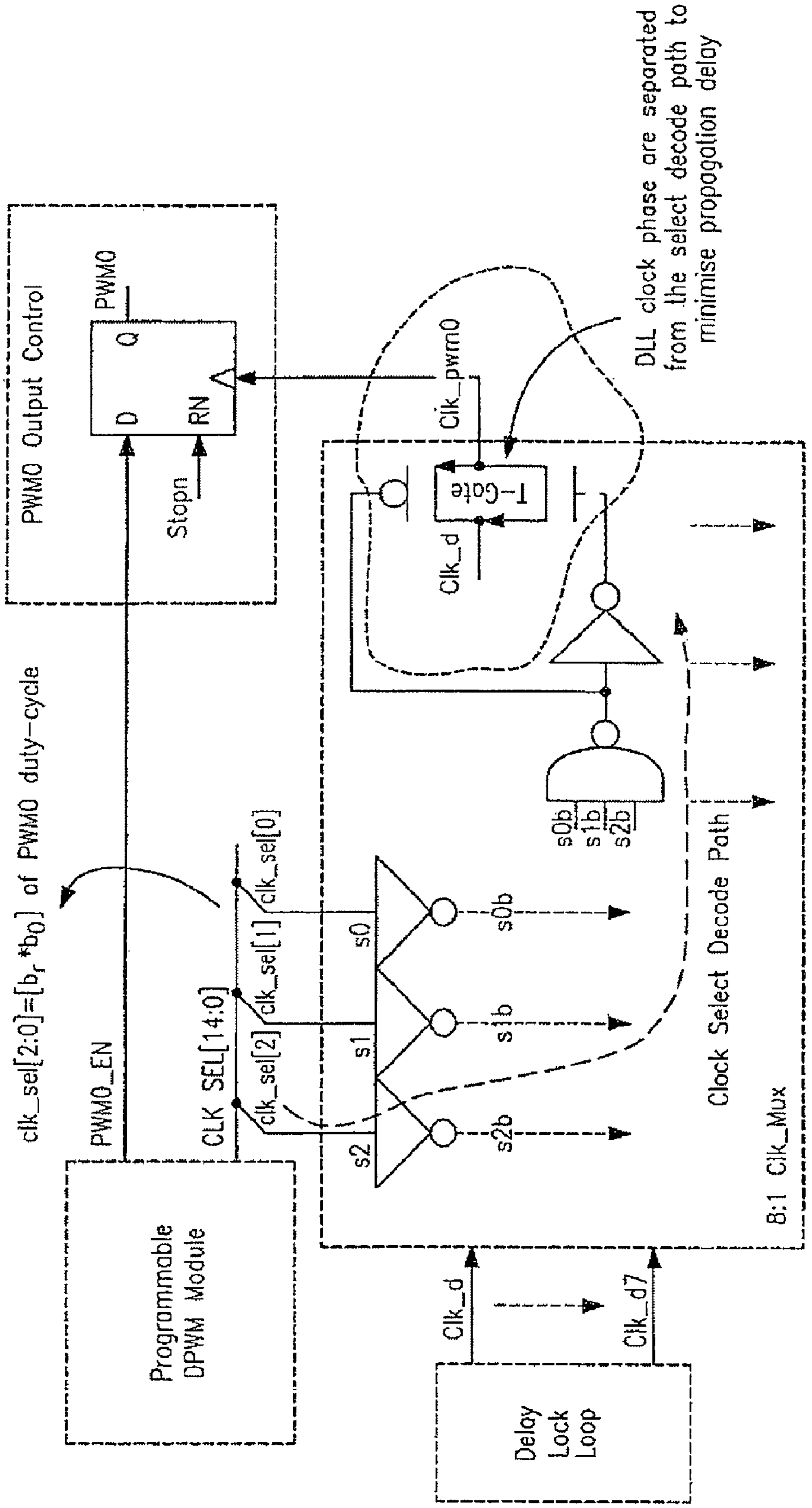
FIG. 10 shows a mux slice for DLL output.

Referring again to FIG. 7, the DLL has a lock range of 35 MHz to 145 MHz. To achieve low jitter operation (low supply and substrate noise sensitivity), the buffer stages in the VCDL use differential clocked buffers. Referring to FIG. 10, the DPWM module 2 generates the select signals for choosing which DLL clock phase should reset the PWM signal from high to low during the switching period. To minimize the propagation delay for the DLL clock phase through the 8:1 mux (providing adequate clock setup time for the PWM flip-flop) the clock phases are separated from the decode logic within the mux and passed to the output via a transmission gate. FIG. 10 shows one slice of the 8:1 mux illustrating how clk_d is fed directly to the T-Gate from the DLL. In Switched Mode Power Converters, the output voltage and current need to be regulated. Samples of the regulated output voltage and possibly extra signals must be taken periodically (sampling), and converted into digital signals (quantisation). Within a switching cycle the preferred sampling time point is determined mainly by three (partially conflicting) requirements:

1. samples should be taken as early as possible to ease ADC and discrete controller latency requirements,
2. samples should be taken when synchronised noise in the power circuit is low, and
3. samples should be taken at the time point when the instantaneous value of the regulated signal (approximately) reflects its average value.

Based on a trade-off of these requirements the DPWM 1 generates an analogue-to-digital converter (ADC) sample and hold pulse called ADC_S&H at exactly one half of the programmed duty-cycle of PWM0 every switching cycle.

A special case of a zero value duty-cyle is required for the ADC_S&H signal. In this case the point at which the ADC_S&H signal is generated in the switching period can be programmed through the control block.

Generally, the DPWM produces programmable duty cycles in a range from 0% to 100%. Certain switching power converter end applications may require (or may benefit from) a reduced duty cycle range. As an example, certain switching power converter topologies such as isolated forward converters may never exceed a certain maximum duty cycle or else transformer saturation may occur. Transformer saturation will typically lead to power stage destruction. Other applications may require that after startup the duty cycle never falls below a certain minimum value. A minimum duty cycle may be required by power converter secondary side circuit blocks in order to remain continuously operational. It is therefore desirable to equip the DPWM with an independently programmable upper and lower duty cycle clamp. Whenever the commanded duty cycle from the external DSP host exceeds the maximum clamp level programmed by the CPU, the DPWM will produce the maximum duty cycle. Whenever the commanded duty cycle from the DSP falls below the minimum clamp level programmed by the CPU, the DPWM will produce the minimum duty cycle. Clamping is implemented by the control block 20. There is a wide variety of switching converter topologies using the DPWM 1 of the invention. The converter topologies may be categorised by the number of controlled power switches. Typically, the number of controlled switches ranges from one to four. The converter topologies may be further categorised by the phase relationships between the driving signals. It is an advantage of the DPWM 1 that it supports switching topologies with any number of controlled switches (typically up to four, but this is readily extended). The disclosed DPWM also supports at least two phasing modes (referred to as "Mode 0: complementary" and "Mode 1: alternating").

Figure 11:
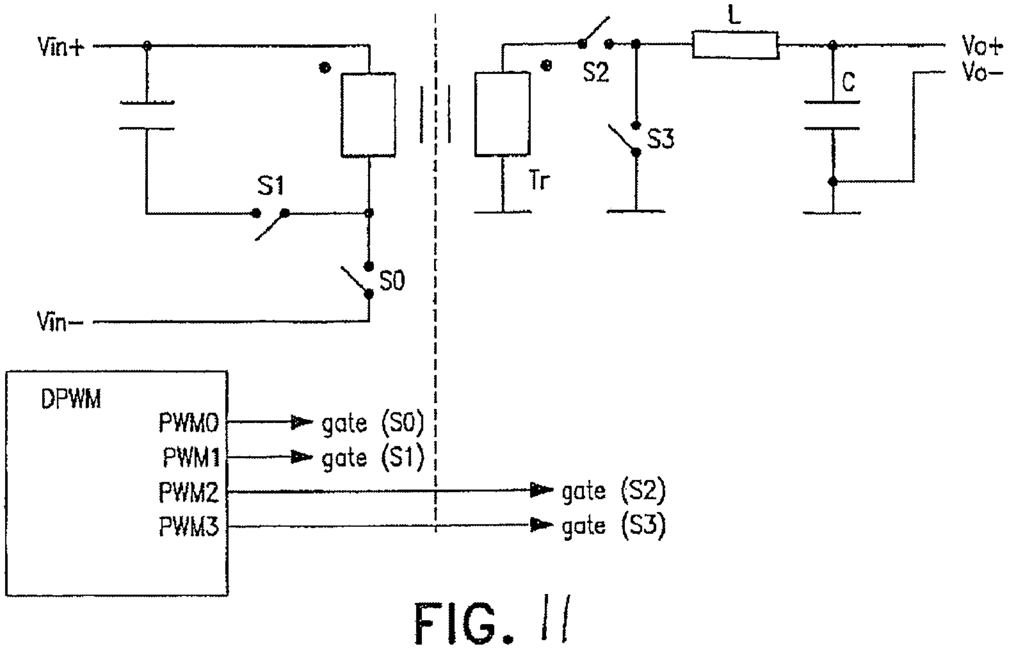
FIG. 11 is a diagram of a single-ended active clamp forward converter driven by a DPWM of the invention.
Figure 13:
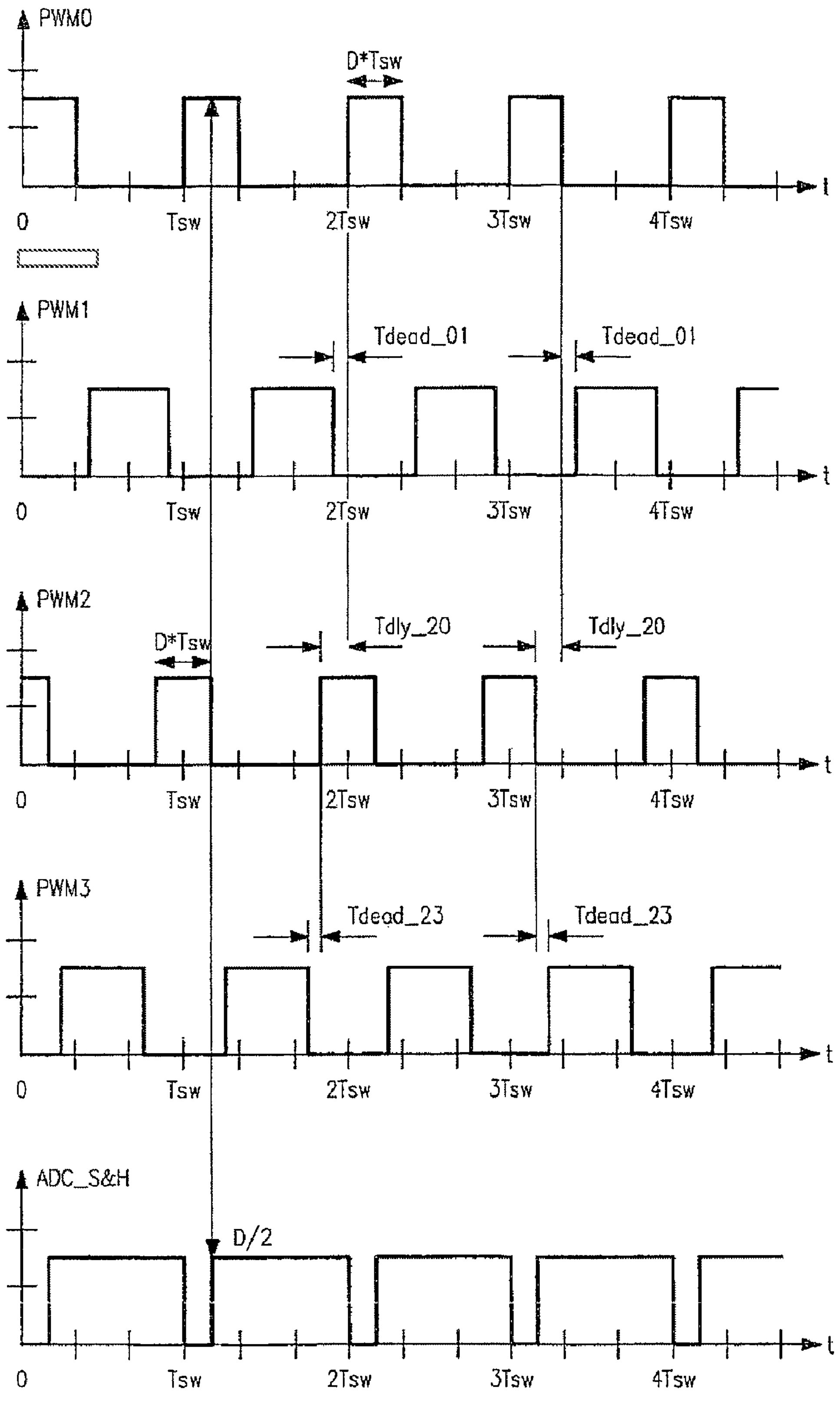
FIG. 13 is a set of DPWM output signals in Mode 0: complementary.

In complementary mode, two sets of two signals each (PWM0 and PWM1, PWM2 and PWM3) are generated as shown in FIG. 13 which are approximately out of phase with respect to each other (neglecting small dead times). The complementary mode is useful for switching converters as shown in FIG. 11 where power switches need to operate out of phase, such as active clamp forward converters and asymmetrical half bridge converters, with or without synchronous rectification.

Figure 12:
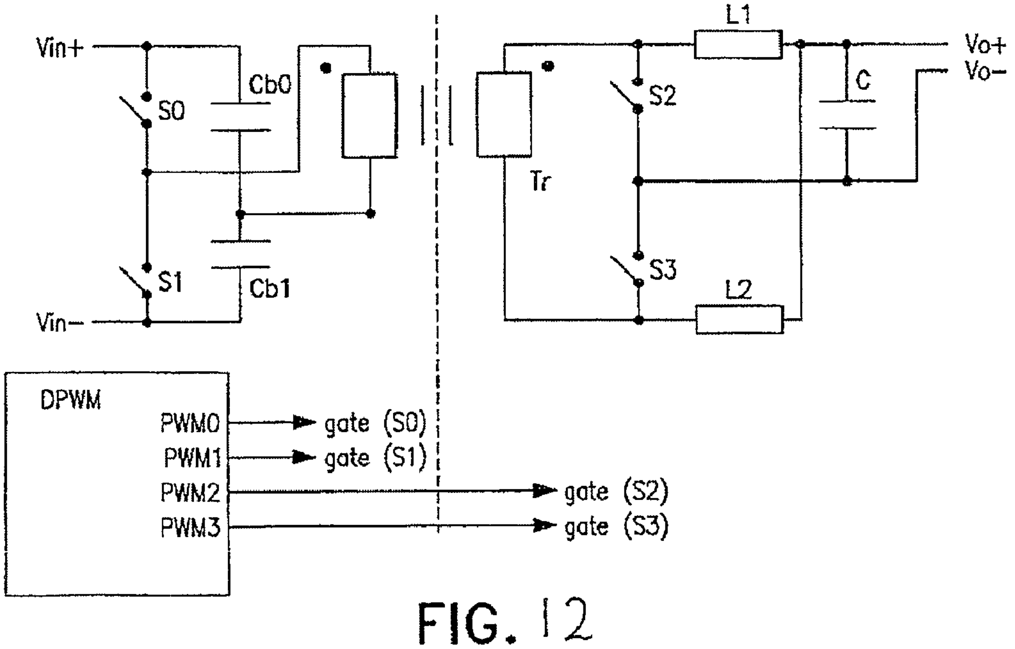
FIG. 12 is a diagram of a double-ended symmetrical half-bridge converter driven by a DPWM of the invention.
Figure 14:
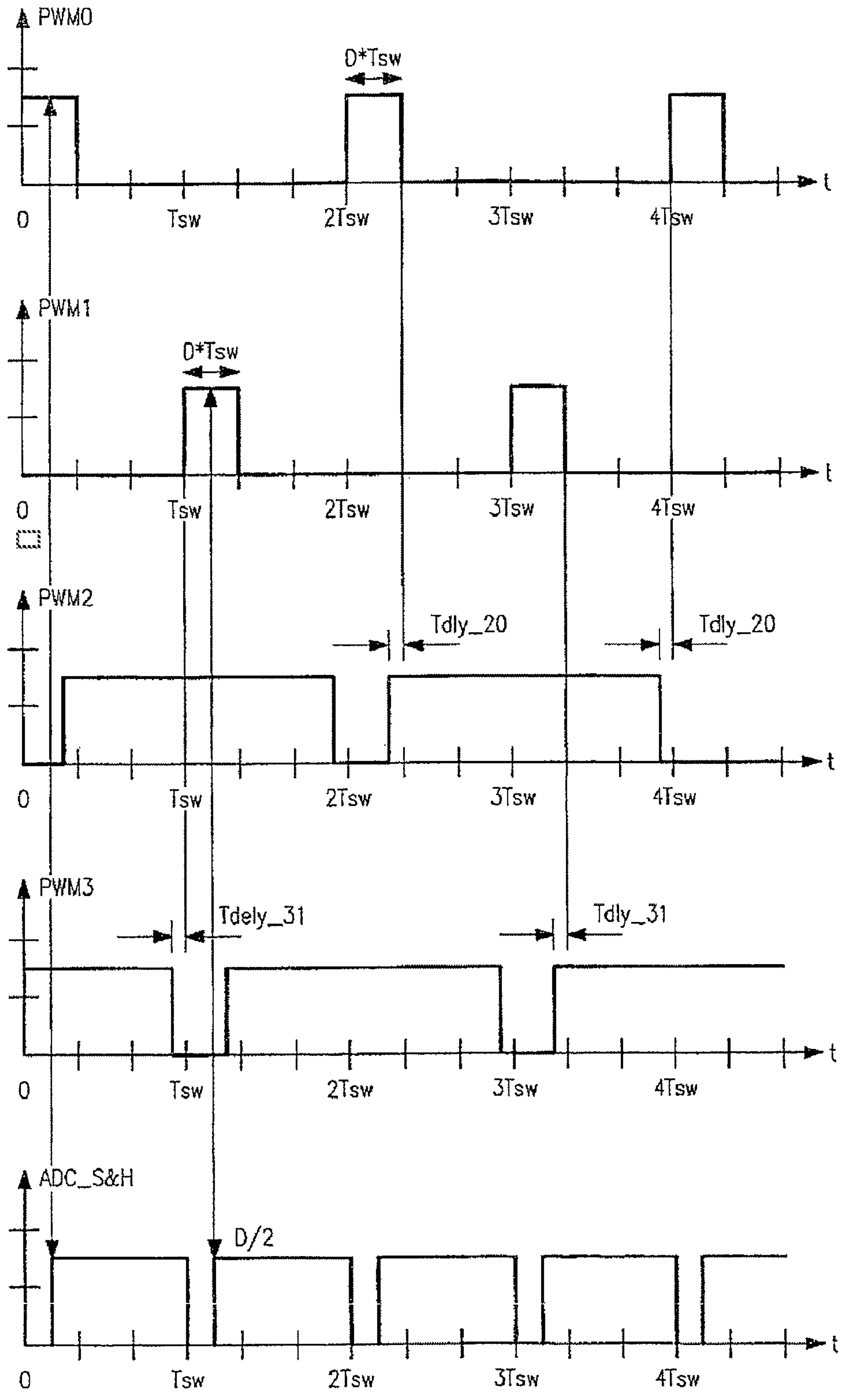
FIG. 14 is a set of DPWM output signals in Mode 1: alternating.

In alternating mode, a set of alternating signals (PWM0 and PWM1), as well as a set of overlapping signals (PWM2 and PWM3) is generated as shown in FIG. 14. The alternating mode is useful for power converters where a set of power switches need to turn on and off in an alternating fashion, and a different but synchronised set of switches need to turn on and off in an overlapping fashion. Examples for switching converters requiring the alternating mode include forward push-pull converters as well as symmetrical half bridge converters as shown in FIG. 12. In this mode the overlapping signals are useful to drive synchronous rectifiers (if present).

Switching power converters can be controlled using voltage mode or current mode control. Voltage mode control typically requires trailing edge PWM signals. However in current mode control the end application may require that the output inductor peak, average or valley current is the controlled variable.

Figure 15:
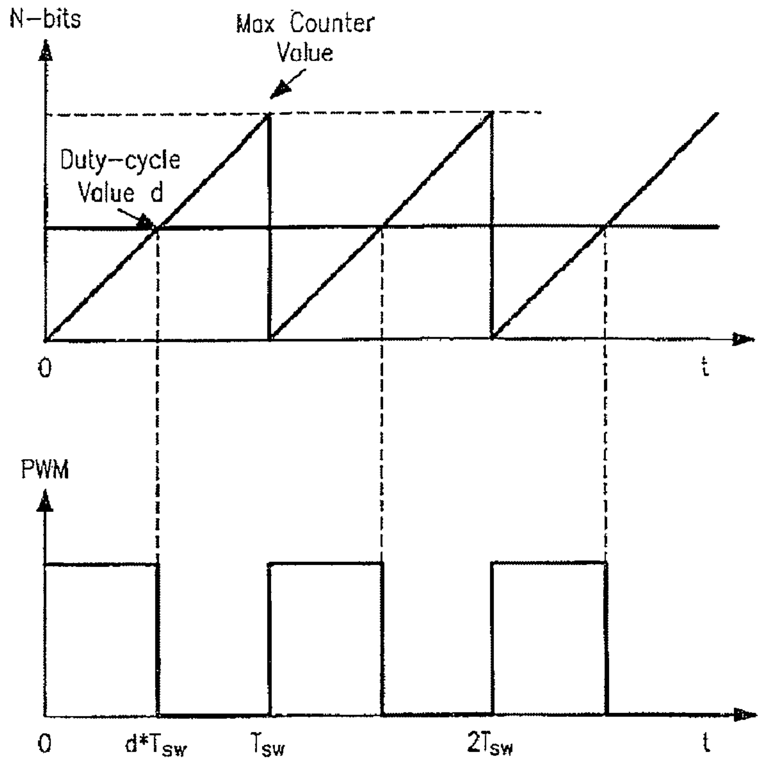
FIG. 15 is a pair of plots showing digital pulse width trailing edge modulation.

FIG. 15 illustrates trailing edge pulse width modulation where the falling edge of the PWM signal is controlled by the programmed duty-cycle. This type of modulation scheme can be used for voltage mode controllers or current mode controllers where the valley inductor current is the control variable.

Figure 16:
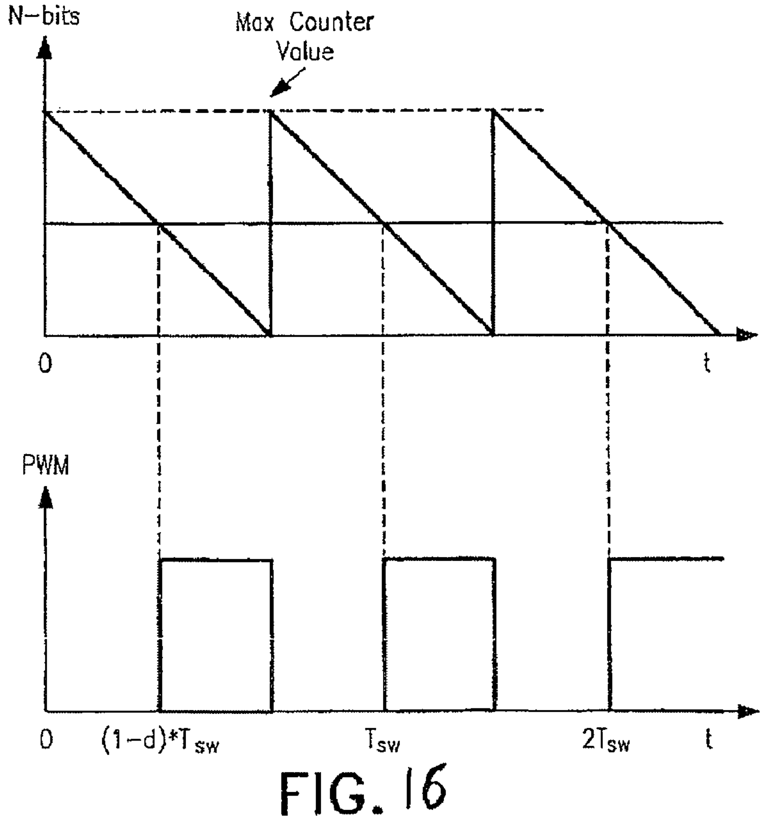
FIG. 16 shows leading edge modulation.

FIG. 16 illustrates leading edge pulse width modulation where the rising edge of the PWM signal is controlled by the programmed duty-cycle. This type of modulation scheme can be used for current mode controllers where the peak inductor current is the control variable.

Figure 17:
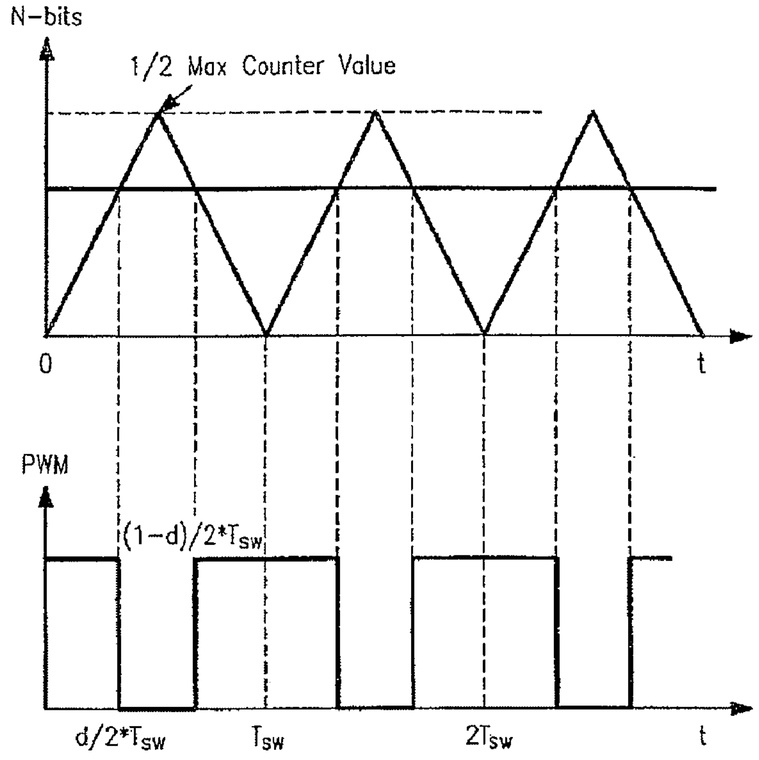
FIGS. 17 and 18 are plots showing digital pulse width trailing and leading triangle modulation respectively.

FIG. 17 illustrates trailing triangle modulation. The programmed duty-cycle d is effectively split in half The PWM signal goes high at the start of the switching cycle for this d/2 value and then goes low. The PWM signal returns high at d/2 from the end of the switching period (1-d/2).

Figure 18:
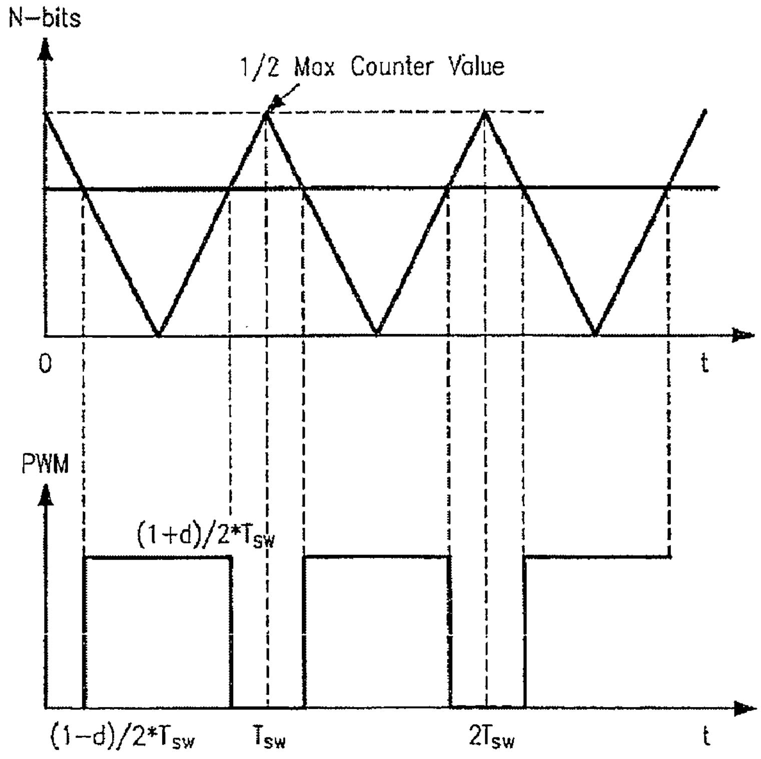

FIG. 18 illustrates leading triangle modulation.

The DLL can be modified to achieve M delay stages further increasing the resolutions and switching frequency ranges possible. Lower resolution switching frequencies can be obtained by using the programmable DPWM module 2 standalone (i.e. without the need for the DLL) resulting in a truly all-digital DPWM solution.

Assuming an on-chip Phase-Locked Loop (PLL) the input clock to the DLL may also be made programmable. Advantageously, the functionality of an on-chip phase locked loop may be employed to provide a programmable clock for the DPWM. In this arrangement, the locked loop functionality described above may be provided by the phase locked loop rather than a separate delay locked loop. In this arrangement, a phase locked loop (PLL) is provided with a plurality of outputs. Each output representing a different phase. It will be appreciated that each phase represents a different delay and accordingly the different phase outputs may be used in the same way as the outputs from the delay locked loop. As would be familiar to those skilled in the art, the output frequency of a phase locked loop may be programmed or adjusted by means of an appropriate circuit.

Figure 19:
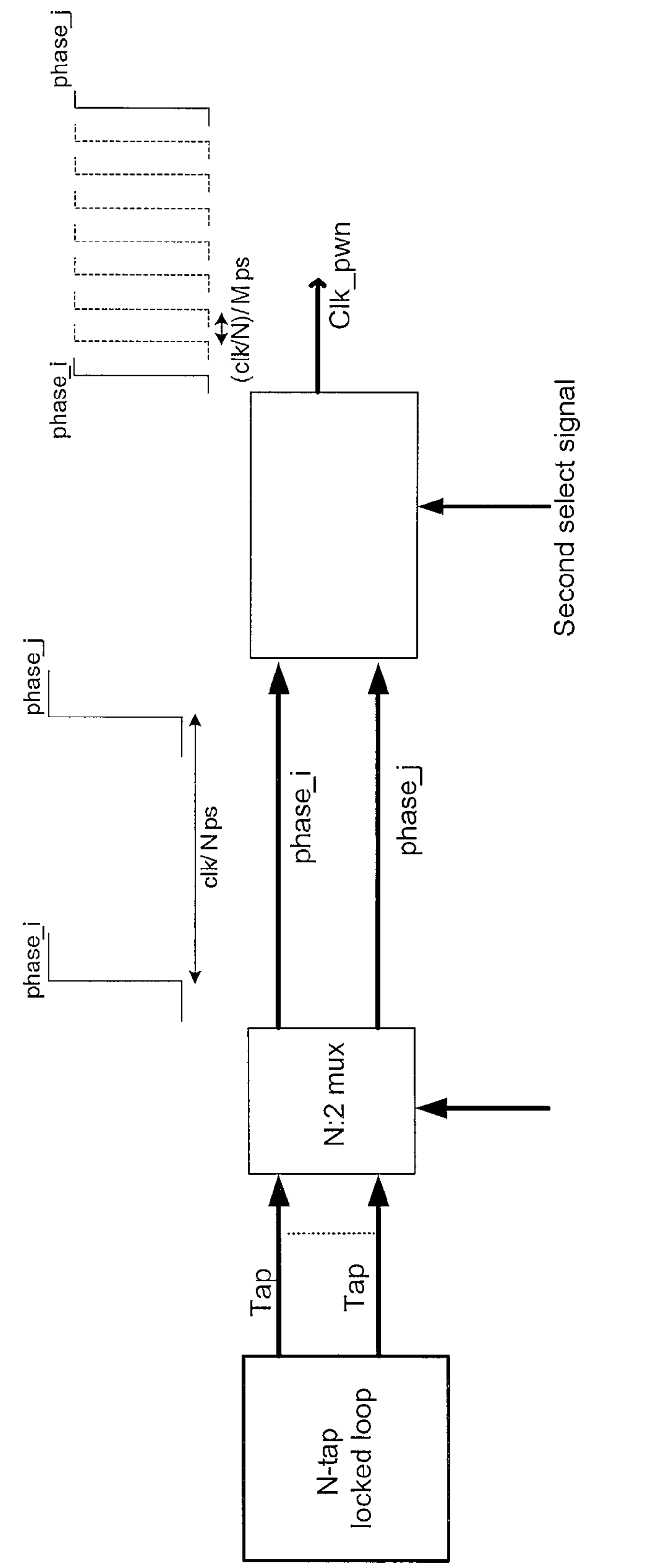
FIG. 19 illustrates a further DPWM circuit in which an interpolator is included to increase the resolution of the DPWM.

FIG. 19 is a further arrangement in which the resolution may be increased further by using the locked loop to provide coarse resolution (as described previously) with a further circuit providing fine resolution. In the exemplary circuit, a PLL is employed to provide multiple phases for coarse resolution and a phase interpolator is employed to interpolate between two selected phases from the loop to provide for fine resolution. Equally, a delay locked loop may be employed. Thus in the exemplary arrangement, the first multiplexor is responsive to a select signal and is used to select two of the possible N delayed signals from the locked loop, thus increasing the resolution to N times the clock signal or alternatively stated a simulated clock signal N times the frequency of the actual input clock.

The interpolator accepts the two phases from the first multiplexor and provides a plurality (M) interpolated signals between the two phases. A further multiplexor is employed to select one of the interpolated signals based on a further select signal to provide a simulated clock signal which may be used per which may be used per the signals of clk_pwn0, clk_pwn1, clk_pwn2, clk_pwn3 and clk_adc signals of FIG. 5. Thus the first select signal provides the higher order bits of resolution and the second select signal provides the lower order bits of resolution and the clock signal resolution is improved by a further factor of N, resulting in a simulated clock signal of M×N times the actual clock input.

Thus whilst a locked loop (for example a PLL or DLL) may be employed to achieve higher DPWM resolution from a lower operating clock frequency for example in the arrangement of FIG. 5, the addition of a phase interpolator and corresponding multiplexor to the PLL may be advantageously employed to further increase the resolution.

As an example consider a PLL producing a 256 MHz reference clock (3.90625 ns period) and having a 16-tap Voltage controlled Oscillator (VCO) delay line structure each VCO tap gives a time step of 3.90625/16=244 ps. Selecting a VCO phase (phase_i) and the phase next to it (phase_j) and applying these to an M-level interpolator allows the VCO time step of 244 ps to be further sub-divided into M divisions. As shown in the exemplary circuit, with M=8 the interpolator is capable of producing time steps of 32 ps each (244 ps/8).

This enables an LSB step size of 32 ps for the DPWM versus 244 ps if only using the VCO tapped delay line in the PLL and taking the DPWM reset signal for it rather than the interpolator.

The application is not limited to the embodiments described but may be varied in construction and detail.

The invention claimed is:

1. A switched mode power converter controller (SMPCC) for providing a PWM control signal to a power switch in a switching cycle, the SMPCC controller having a hybrid Digital Pulse Width Modulator (DPWM), the hybrid DPWM effecting the PWM control signal at a switching point at a resolution of N bits across the switching cycle, the hybrid DPWM comprising:

a) a counter circuit responsive to a clock signal and determining the switching point at a first resolution, the counter circuit providing an enable output signal at the determined switching point, b) a locked loop for delaying the clock signal to provide multiple clock phases from the clock signal, c) a first multiplexer for selecting a first one of the multiple clock phases and a second one of the multiple clock phases adjacent to the selected first clock phase in response to a received first select signal, d) an interpolator responsive to the selected first and second clock phases and interpolating between the selected two clock phases to provide a plurality of interpolated phases between the selected two clock phases, e) a second multiplexer for selecting one of the plurality of interpolator phases in response to a received second select signal for use as the PWM control signal.

2. The SMPCC claim 1, further comprising an output control element having the second multiplexor output as an input, wherein the control element is enabled by the enable output signal from the controller, and wherein the controller generates the first and second multiplexor select signals so as to provide the PWM control signal.

3. The SMPCC of claim 1, further comprising a control block for interfacing with an external host.

4. The SMPCC of claim 1, wherein the counter circuit is provided in a state machine.

5. The SMPCC according to claim 1, wherein the SMPCC is configured to provide an ADC sample and hold output signal.

6. The SMPCC of claim 5, wherein the ADC sample is provided when the duty-cycle value of the PWM control signal is zero.

7. The SMPCC of claim 1, wherein the SMPCC is configured to respond to an asynchronous stop input forcing the PWM control signal to zero in less than 1 ns.

8. The SMPCC of claim 1, wherein the SMPCC, wherein the duty-cycle of the PWM control signal can be clamped to programmable minimum and maximum values.

9. The SMPCC of claim 1, wherein the SMPCC, generates multiple PWM control signals from programmed parameters.

10. The SMPCC of claim 1, wherein the duty-cycle of the PWM control signal is programmable from 0-100%.

11. The SMPCC of claim 1, wherein the locked loop is a phase locked loop.

12. The SMPCC of claim 11, wherein the phase-locked loop is programmable to adjust the frequency of the clock signal.

13. The SMPCC of claim 1, wherein the locked loop is a delay locked loop.

14. The SMPCC of claim 13, further comprising a phase-locked loop providing a clock signal to the delay locked loop.

15. The SMPCC of claim 14 wherein the phase-locked loop is programmable to adjust the frequency of the clock signal.

16. The SMPCC of claim 1, wherein the frequency of the switching cycles is from 100 KHz-15 MHz.

17. The SMPCC of claim 1, wherein the SMPCC provides a plurality of PWM control signals.

18. A switched mode power converter controller (SMPCC) for providing a plurality of control signals for operating individual power switches within a switching cycle of a switching converter, the SMPC controller having a hybrid Digital Pulse Width Modulator (DPWM), the hybrid DPWM generating each of the control signals at switching points across the switching cycle at a resolution of N bits, the hybrid DPWM comprising:

a) a counter circuit responsive to a clock signal, b) a plurality of controllers comprising a plurality of comparators, each of the comparators being associated with an individual control signal and determining the switching point of the control signal at a resolution less than N and providing individual enabled signals at said determined switching points, c) a locked loop for delaying the clock signal to provide a plurality of clock phases from the clock signal, d) a first set of multiplexors, each multiplexor for selecting two of the clock phases from the locked loop in response to a select signal, e) a set of interpolators each interpolator interpolating between the selected two phases from a multiplexor of the first set of multiplexors to provide a plurality of interpolated outputs, f) a second set of multiplexers, each of the multiplexors of the second set for selecting an interpolated output from an interpolator.

19. The SMPCC of claim 18 further comprising a plurality of output control elements, each of the individual control elements being enabled by an enable signal received from an associated comparators.

20. The SMPCC as claimed in claim 19, further comprising a control block for controlling the SMPCC wherein each of the controllers operate independently to provide enable and first and second select signals based on parameters from the control block.

21. The SMPCC of claim 18, wherein the locked loop is a phase-locked loop.

22. The SMPCC of claim 21, wherein the phase loocked loop is programmable to adjust the frequency of the clock signal.

* * * * *